(12) United States Patent
Auracher et al.

(10) Patent No.: US 7,032,190 B2
(45) Date of Patent: Apr. 18, 2006

(54) INTEGRATED CIRCUITS, AND DESIGN AND MANUFACTURE THEREOF

(75) Inventors: Stefan Auracher, Baierbrunn (DE); Claus Pribbernow, München (DE); Andreas Hils, Unterhaching (DE)

(73) Assignee: LSI Logic Corporation, Milpitas, CA (US)

( * ) Notice: Subject to any disclaimer, the term of this patent is extended or adjusted under 35 U.S.C. 154(b) by 182 days.

(21) Appl. No.: 10/724,996

(22) Filed: Dec. 1, 2003

(65) Prior Publication Data

US 2005/0120321 A1 Jun. 2, 2005

(51) Int. Cl.
*G06F 17/50* (2006.01)

(52) U.S. Cl. ............................................. 716/1; 716/16
(58) Field of Classification Search .................... 716/1, 716/16, 17
See application file for complete search history.

(56) References Cited

U.S. PATENT DOCUMENTS

| | | | |
|---|---|---|---|
| 5,696,943 A | 12/1997 | Lee | |
| 6,093,214 A | 7/2000 | Dillon | |
| 6,255,845 B1 * | 7/2001 | Wong et al. | 326/38 |
| 6,446,248 B1 * | 9/2002 | Solomon et al. | 716/17 |
| 2004/0049754 A1 | 3/2004 | Liao et al. | |

OTHER PUBLICATIONS

Tsu-Wei Ku, "Using 'empty space' for IC congestion relief", EEdesign, Jun. 19, 2003, pp. 1-7.

* cited by examiner

*Primary Examiner*—Vuthe Siek
(74) *Attorney, Agent, or Firm*—Christopher P. Maiorana, P.C.

(57) ABSTRACT

A representation of a macro for an integrated circuit layout. The representation may define sub-circuit cells of a module. The module may have a predefined functionality. The sub-circuit cells may include at least one reusable circuit cell. The reusable circuit cell may be configured such that when the predefined functionality of the module is not used, the reusable circuit cell is available for re-use.

24 Claims, 13 Drawing Sheets

US 7,032,190 B2

INTEGRATED CIRCUITS, AND DESIGN AND MANUFACTURE THEREOF

U.S. GOVERNMENT RIGHTS

This invention was made with government support under the terms of Contract No. DE-FC04-2000AL67017 awarded by the Department of Energy. The government may have certain rights in this invention.

FIELD OF THE INVENTION

The present invention may relate generally to the field of integrated circuits, and the design and manufacture thereof. In one aspect, the invention may relate to a design technique in which a custom integrated circuit may be designed based on a predefined layout of integrated circuit elements.

BACKGROUND TO THE INVENTION

Application Specific Integrated Circuits (ASICs) and Field Programmable Gate Arrays (FPGAs) provide different technologies for implementing a custom integrated circuit. However, there is significant commercial and technical gap between ASIC and FPGA technologies. An ASIC is custom designed for a specific circuit application. An ASIC can offer optimum performance, but designing an ASIC is expensive and time-consuming. Circuit faults in ASICS can also be difficult and expensive to correct. An ASIC is also expensive to manufacture if in small volumes. An FPGA is a general purpose array of logic gates that can be configured as a custom circuit. An FPGA provides greater versatility than an ASIC, because an FPGA is not custom designed for a specific application. Although generally less expensive than an ASIC, an FPGA does not contain dedicated circuitry, and is less optimized than an ASIC. An FPGA has a certain amount of circuit overhead to facilitate the programmability of the FPGA, and is not useable as part of the custom circuit.

It would be desirable to implement a custom circuit efficiently within an integrated circuit that can include custom-independent fabrication layers and custom-specific fabrication layers.

SUMMARY OF THE INVENTION

The present invention may relate to a representation of a macro for an integrated circuit layout. The representation may define sub-circuit cells of a module. The module may have a predefined functionality. The sub-circuit cells may include at least one reusable circuit cell. The reusable circuit cell may be configured such that when the predefined functionality of the module is not used, the reusable circuit cell is available for re-use.

Advantages, features and objects of the invention may include: (i) enabling cells of a module that is not selected for use, to be available as reusable resources; (ii) providing a module architecture to enable cells to be reused if the module is not selected for use; (iii) enabling control of which cells of a module are available for re-use if the module is not selected for use; (iv) providing different representations of a module with different degrees of cell reusability; (v) enabling efficient routing of a connection wire directly over a module that is not selected for use; (vi) reducing or avoiding leakage currents associated with cells of unused modules; and/or (v) extending a versatility of an integrated circuit by distributing sub-circuits within a general-purpose area of the integrated circuit. Other features, objects and advantages of the invention will become apparent from the following description, claims and/or drawings.

BRIEF DESCRIPTION OF THE DRAWINGS

Non-limiting preferred embodiments of the invention are now described, by way of example only, with reference to the claims and accompanying drawings, in which:

FIG. 7 is an enlarged vertical section along the line VII of FIG. 6a;

DESCRIPTION OF PREFERRED EMBODIMENTS

Figure 1:
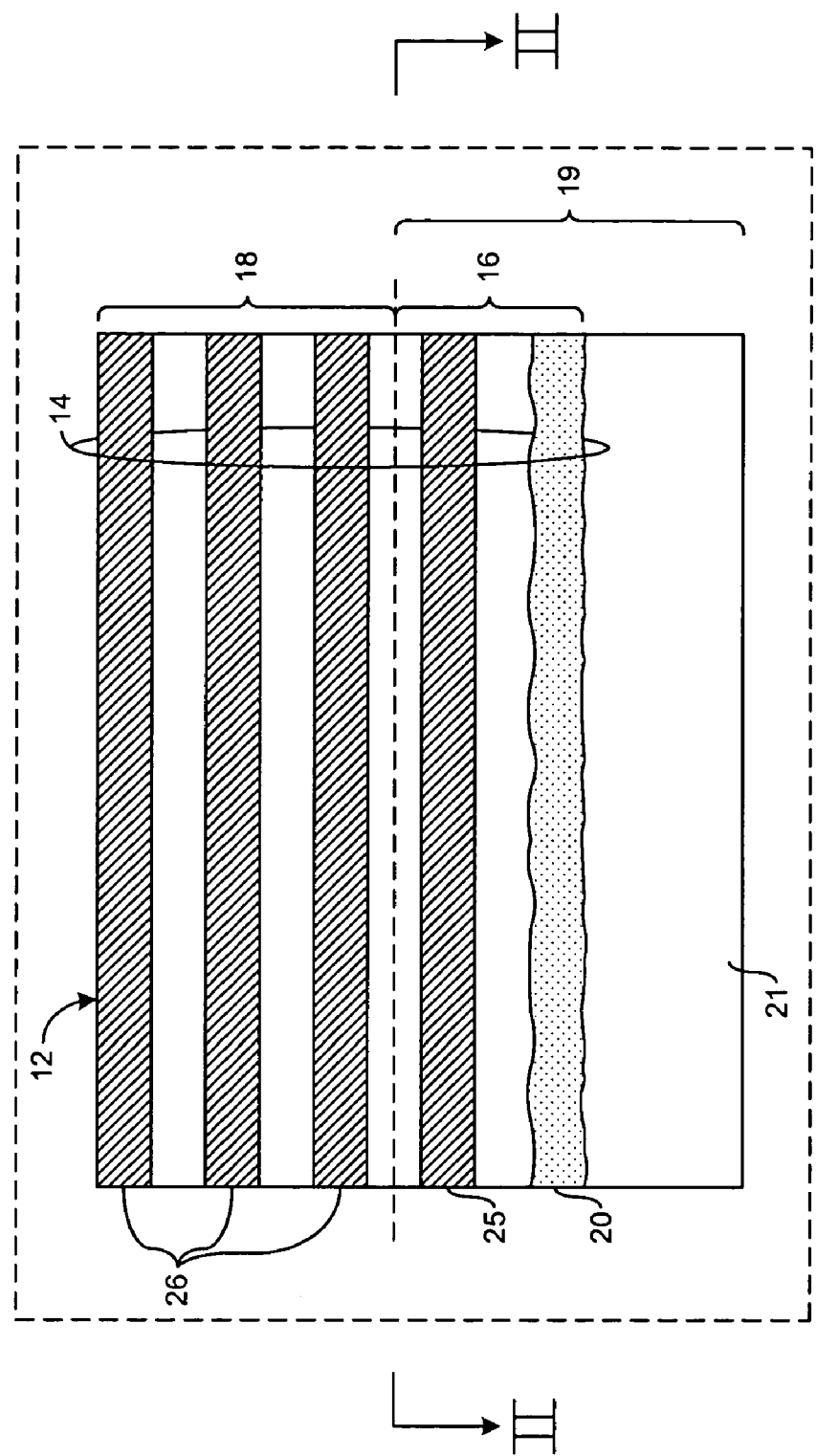
FIG. 1 is a schematic vertical section through a first embodiment of an integrated circuit die.
Figure 2:
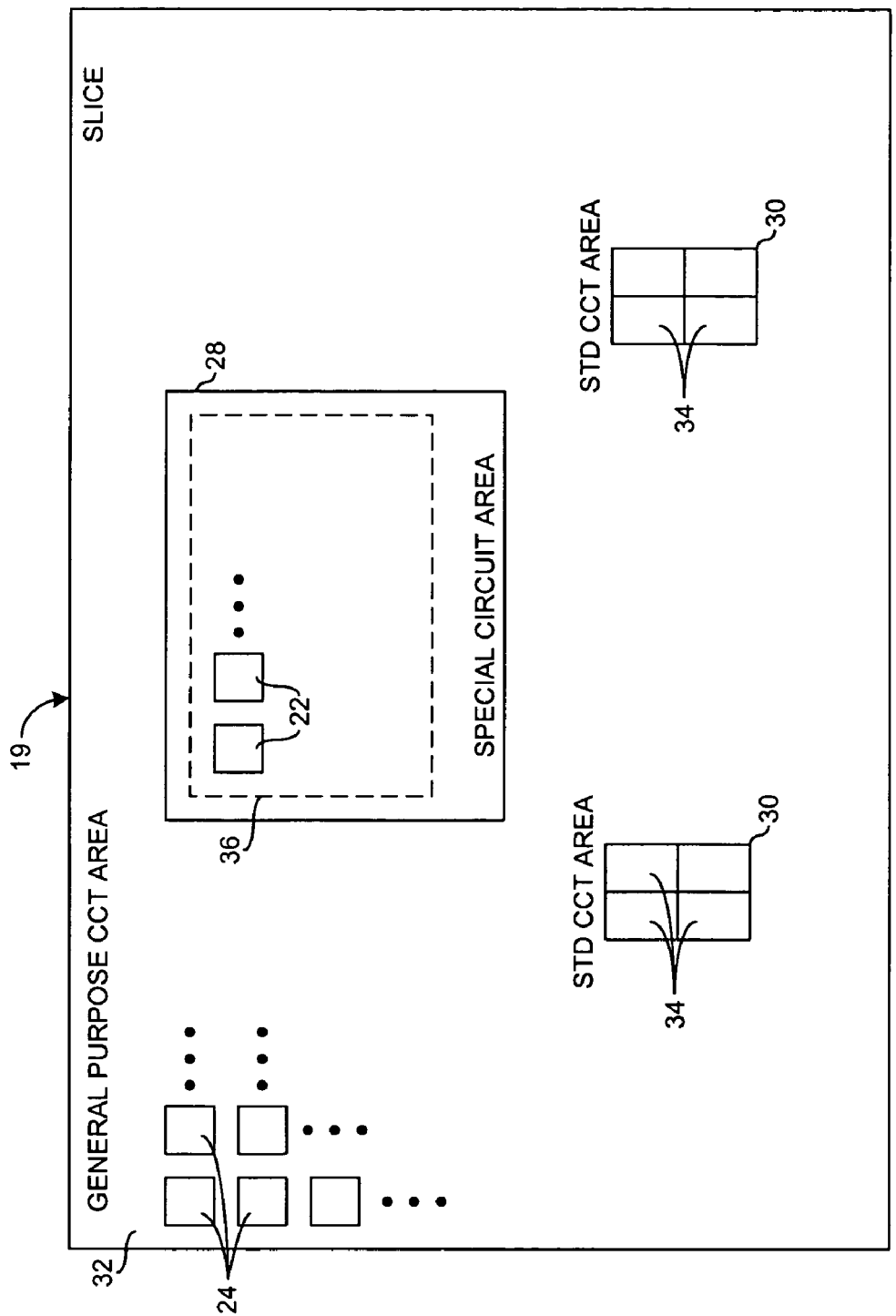
FIG. 2 is a schematic horizontal section along the line II—II of FIG. 1.

Referring to FIGS. 1 and 2, an integrated circuit (IC) 10 is shown. The IC may comprise a die 12 within which a circuit 14 may be implemented. The circuit 14 may be, in one example, a logic circuit. The circuit 14 may be a custom circuit for a dedicated circuit application. The die 12 may include one or more patterned custom-independent layers 16 and one or more patterned custom-specific layers 18 (for the sake of clarity, the patterning is not shown in FIG. 1). The custom-independent layers 16 may be referred to as base layers. The custom independent layers 16 may be pre-designed for a certain general type of circuit application prior to customization. Customization for a specific circuit application may be provided by the custom-specific layers 18. Different dies 12 with different customizations (e.g., different custom-specific layers 18) may include the same custom-independent layers 16.

A portion of the die 12 including only the custom-independent layers 16 may be referred to as a slice 19. In general, a slice is a single die with one or more prefabricated layers. The slice 19 may be pre-fabricated as an intermediate product, and kept as a stock item. In one example, a wafer may contain a number of slices. The wafer may be kept in stock for later customization. The individual slices may be customized prior to or subsequent to dicing of the wafer. The die 12 may be customized by adding one or more custom-specific layers 18 to the pre-fabricated slice 19. The slice 19 may be fabricated efficiently irrespective of a number of dies 12 of a particular customization that may be ordered by a customer. Alternatively, the slice 19 may refer to a portion of a design of the die 12 that is fixed, whether or not the slice may be pre-fabricated as an intermediate product.

Referring to FIGS. 1–3 and 8, the custom-independent layers 16 may comprise at least one integrated layer 20 in which one or more doped diffusion areas may be formed in or on a semiconductor wafer (or substrate) 21 (e.g., made of silicon). The custom-independent layers 16 may define active and/or passive circuit elements that may be coupled together in any manner defined by the custom-specific layers 18. As explained further below, the active and/or passive circuit elements may comprise specialized circuit elements 22 and general-purpose circuit elements 24. The custom-independent layers 16 may comprise at least one layer 25 of conductive material, for example, metal (e.g., aluminium, etc.). The conductive layer 25 may be patterned to provide power supply distribution lines 23 (e.g., one or more of a positive voltage, a ground voltage and a negative voltage) and contacts 46 (46a in FIG. 8) to the integrated layer 20.

The custom-specific layers 18 may comprise one or more interconnection layers 26 for providing connections to and/or between the circuit elements 22, 24, and connections to the power supply distribution layer 25 (e.g., vias). Each interconnection layer 26 may comprise conductive paths, for example, of metal (e.g., aluminium, etc.). Vias 27 may be formed between any of the layers 16 and 18. Vias between the custom-independent layers 16 may be fixed as part of the design of the custom-independent layers. Vias between the custom-specific layers 18 and/or between a custom specific layer 18 and an uppermost layer of the custom-independent layers 16 may depend on the customization of the slice 19.

Referring to FIGS. 1 and 2, the slice 19 may be organized as one or more special circuit areas 28, one or more standard circuit areas 30, and one or more general-purpose circuit areas 32. For the sake of clarity, only a small number of the areas 28, 30 and 32 are illustrated. However, a greater or fewer number of areas may be implemented to meet the design criteria of a particular application. Also, one or more of the types of circuit areas 28, 30 and 32 may be omitted. The general-purpose circuit areas 32 may be areas that may not have a dedicated functionality and/or may be available for full customization. The general-purpose circuit areas 32 may comprise the general-purpose circuit elements 24. The general-purpose circuit elements 24 typically comprise, for example, logic gates (e.g., NOR gates, etc.) that may be interconnected to provide a functionality defined by the interconnection layers 26 of the custom-specific layers 18.

Figure 12:
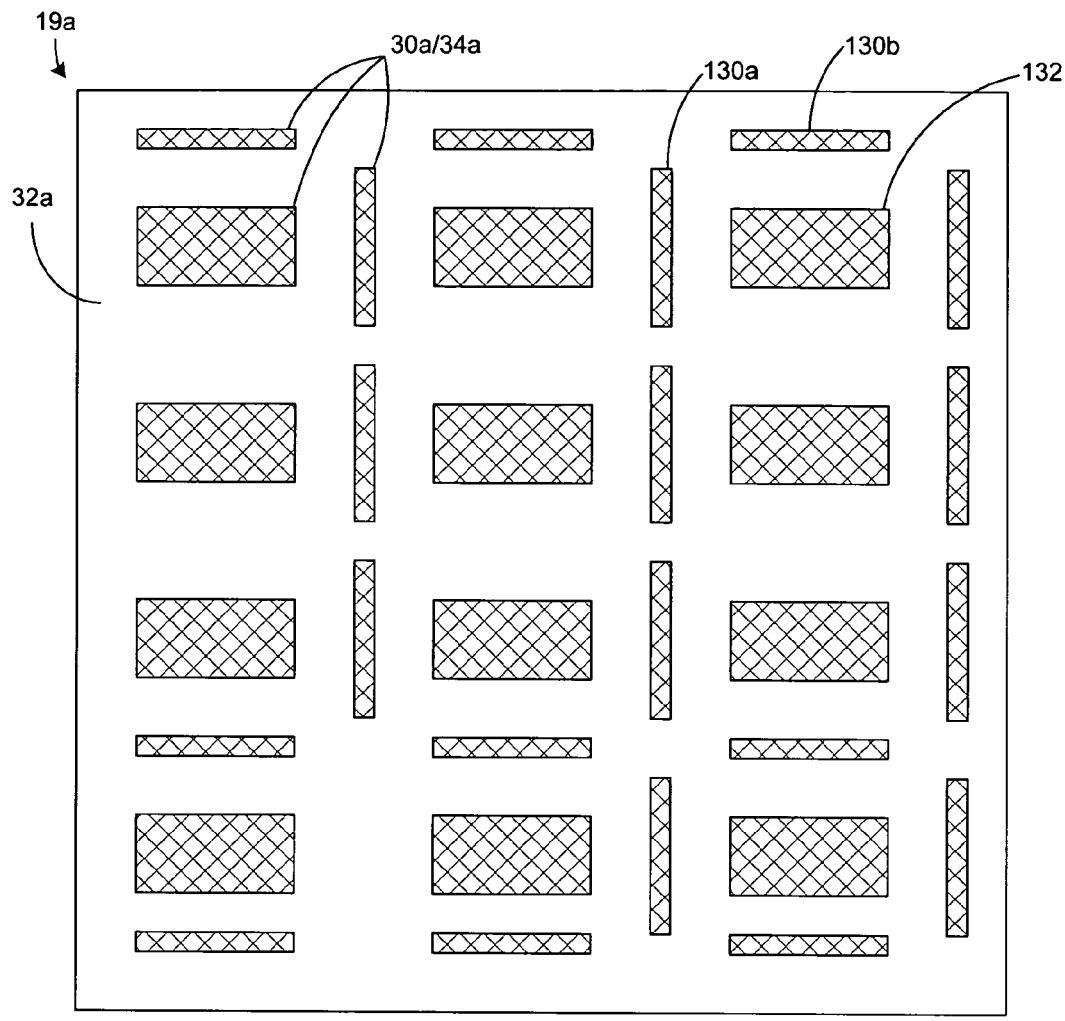
FIG. 12 is a schematic block diagram illustrating a second embodiment of an integrated circuit die.

The standard circuit areas 30 may comprise pre-designed sub-circuits 34 that may be useful within the general-purpose circuit areas 32. The sub-circuits 34 may be referred to as being of low or medium complexity. For example, the sub-circuits 34 may comprise one or more of: buffers; registers; latches; flip-flops; multiplexers; inverters; counters; buffer stacks (e.g., LIFO or FIFO); memories (e.g. multi-location memories, such as memory arrays and/or addressable memories); and pre-built gates (e.g., complex gates, AND gates, OR gates, XOR gates) different from the general-purpose circuit elements 24. The sub-circuits 34 may include respective specialized circuit elements 22. The sub-circuits 34 may provide at least some dedicated functionality more efficiently than may be implemented by the general-purpose circuit elements 24. For example, a sub-circuit 34 that may be implemented using around five specialized transistors (e.g., specialized circuit elements 22) may replace as many as ten or more gates (e.g., general-purpose circuit elements 24) were an equivalent circuit to be implemented in the general-purpose circuit area 32. As illustrated by the example of FIG. 12 (described later), the standard circuit areas 30 may be distributed throughout the die 12 so as to be available locally at different locations across the die 12.

The special circuit areas 28 may provide complicated and/or advanced pre-designed circuit modules 36 that may be useful for the general type of circuit application for which the die 12 may be employed. The modules 36 may also be referred to as macros or as Intellectual Property (IP) blocks. The modules 36 may be referred to as medium or high complexity. The modules 36 may, for example, include one or more of: buffer stacks (e.g., LIFO or FIFO); multi-location memories (e.g. memory arrays and/or addressable memories); signal processor cores; general processor cores; numeric and/or mathematical processor cores; encoders; decoders; transmitters, receivers, communications circuits; analogue circuits; interface circuits; and/or hybrid circuits including combinations of the aforementioned. The modules 36 may comprise respective special circuit elements 22. The special circuit elements 22 may be optimized for the specific functionality of the modules 36. For example, the special circuit elements 22 may be physically smaller than the general-purpose circuit elements 24. The modules 36 in the special circuit areas 28 may provide a higher level of performance and/or greater compactness than may be achieved by implementing equivalent circuits using the general-purpose circuit areas 32. The modules 36 may provide circuits that may not be possible or practical to implement in the general-purpose circuit areas 32.

The above approach to a custom integrated circuit 10 may provide significant advantages and may bridge the commercial and technical gap between ASIC and FPGA integrated circuits. The sub-circuits 34 and/or the modules 36 may provide a level of performance and reliability normally associated with ASICs. The general-purpose circuit areas 32 and the custom-specific layers 18 may provide a versatility normally associated with FPGAs while reducing a hardware overhead inherent in FPGAs. Also, the use of custom-independent layers 16 may enable fabrication costs to be reduced. Design and/or testing and/or fabrication efficiency may be improved. The slices 19 may be pre-fabricated, tested and stored in inventory. The custom-specific layers may be added to a pre-fabricated slice 19 to form the finished (customized) die 12. Even if a designer decides not to use one or more of the sub-circuits 34 and/or modules 36 in a particular customization, the cost savings and other efficiencies resulting from implementing the slice 19 with fixed, custom-independent layers 16 may significantly outweigh the cost overhead of unused circuitry.

Figure 3:
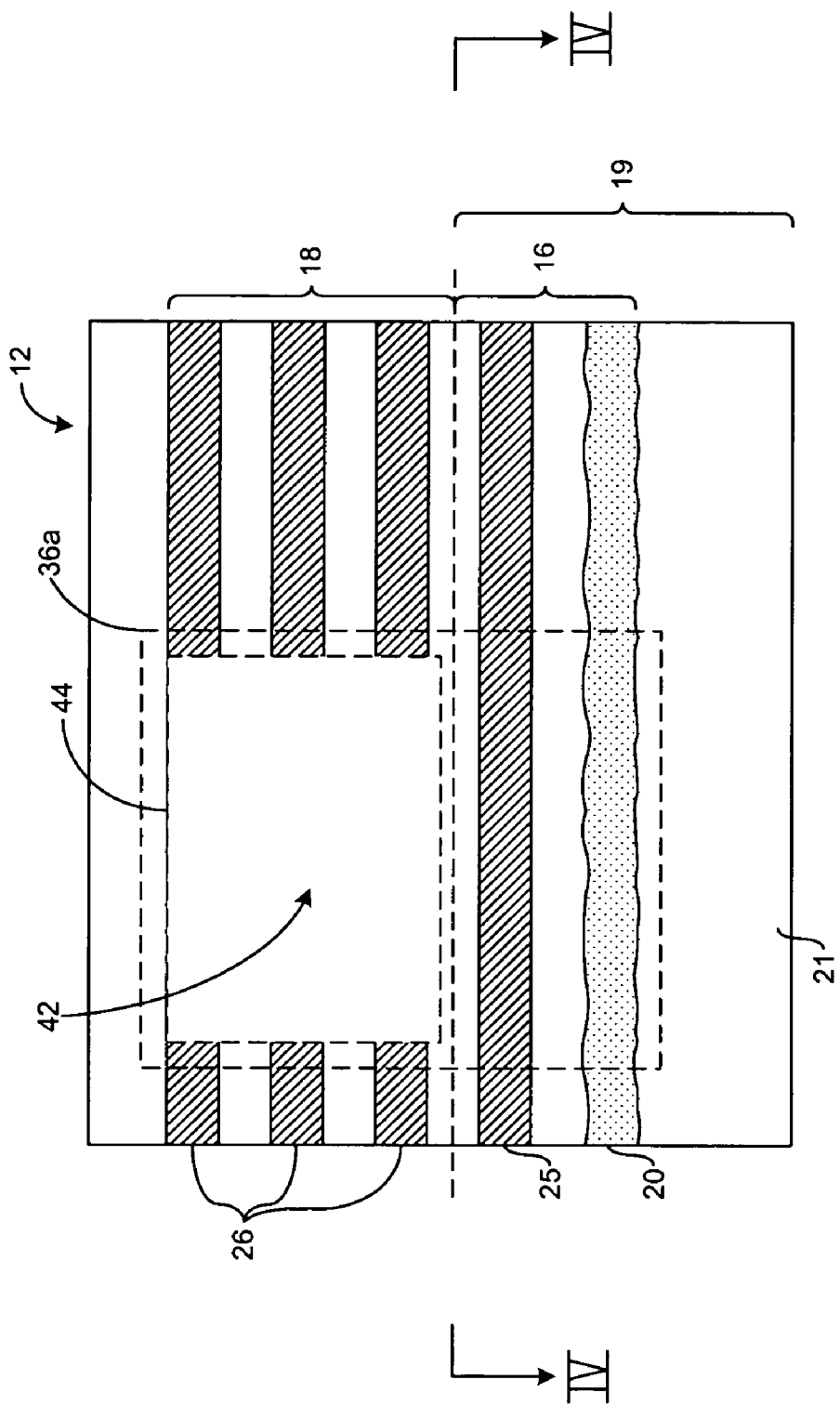
FIG. 3 is a schematic vertical section showing a module of the die of FIG. 1.
Figure 4:
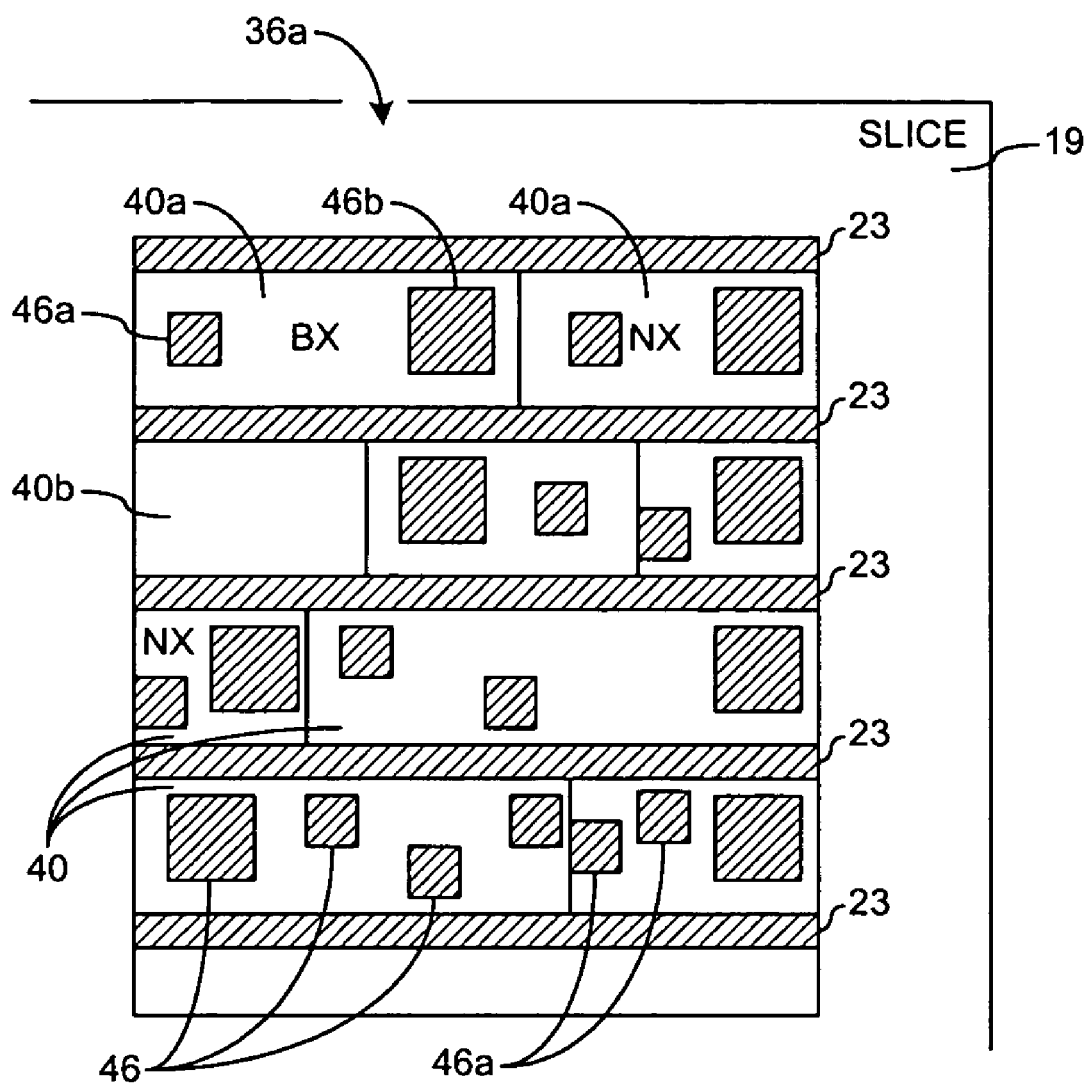
FIG. 4 is a schematic horizontal section along the line IV—IV of FIG. 3, showing the module in more detail.

Referring to FIGS. 3 and 4, a particular module 36a may comprise a plurality of circuit cells 40 that together form the module 36a. Each cell 40 may comprise respective specialized circuit elements 22. The cells 40 may have terminals 46 formed in the conductive layer 25 (e.g., the plane of FIG. 4). The term "terminals" may be used herein very broadly, and may encompass any form of metallization, pin or electrode to which an interconnection may be made. The terminals 46 may include at least one input terminal 46a and/or at least one output terminal 46b. When the designer employs the module 36a intact, appropriate connections to and/or between the cells 40 may be made by an arrangement of interconnections 42 within the interconnection layers 26

(custom-specific layers 18) overlying the cells 40. In FIG. 3, the arrangement of interconnections 42 are depicted as a general block to avoid cluttering the drawing. The interconnections 42 may define a reserved portion 44 of the custom-specific layers 18 that may be dedicated to the module 36*a*. The reserved portion 44 may extend into all of the custom-specific layers 18. A distinction between at least some of the sub-circuits 34 and the module 36*a* may be that the module 36*a* may comprise the plurality of circuit cells 40 and/or the reserved portion 44. When the designer chooses to use the module 36*a*, the reserved portion 44 may be unavailable for other uses, such as routing and/or other custom interconnections. The reserved portion 44 of the custom-specific layers 18 may not be available for customization.

When the designer chooses not to use the module 36*a*, at least some of the reserved portion 44 may be freed (made available) for other uses, such as routing and/or other custom interconnections. Additionally, the plurality of circuit cells 40 may remain in the slice 19 as part of the custom-independent layers 16 that are fixed in the design of the slice 19. The module 36*a* may have an architecture to enable at least some of the circuit cells 40 to be reusable resources when the module 36*a* is not chosen for use as a complete module 36*a*. The circuit cells 40 may include one or more reusable cells 40*a* having a functionality that may be re-useable. For example, the reusable cells 40*a* may be similar to the sub-circuits 34. The reusable cells 40*a* may, for example, include one or more buffers (BX) and one or more inverters (NX). Although not shown explicitly, the reusable cells 40*a* may additionally or alternatively include, for example, one or more of: registers; latches; flip-flops; multiplexers; counters; buffer stacks (e.g., LIFO or FIFO); memories (e.g. multi-location memories, such as memory arrays and/or addressable memories); and pre-built gates (e.g., complex gates, AND gates, OR gates, XOR gates, and NOR gates). All of the reusable cells 40*a* may have terminals 46 at the conductive layer 25, to enable customized connections to be made from the custom-specific layers 18 to the reusable cells 40*a*. All of the cells 40 of the module 36*a* may comprise reusable cells 40*a*, or at least some of the cells 40*b* may not be re-usable. The non-reusable cells 40*b* may comprise circuits that may be too design-sensitive to be re-useable outside the module 36*a* and/or may not have an independent functionality. Additionally or alternatively, the non-reusable cells 40*b* may be certain cells 40 which are not authorized for re-use. Multiple representations (or models or views) of the module 36*a* and/or the cells 40 may be prepared. Each representation may have a different level of reusability of the cells 40, to suit different design situations. The preferred embodiments may enable the reusable cells 40*a* to be used as (i) additional sub-circuits available within the custom design and/or (ii) repeater cells useful for routing signals within the die 12.

Figure 5:
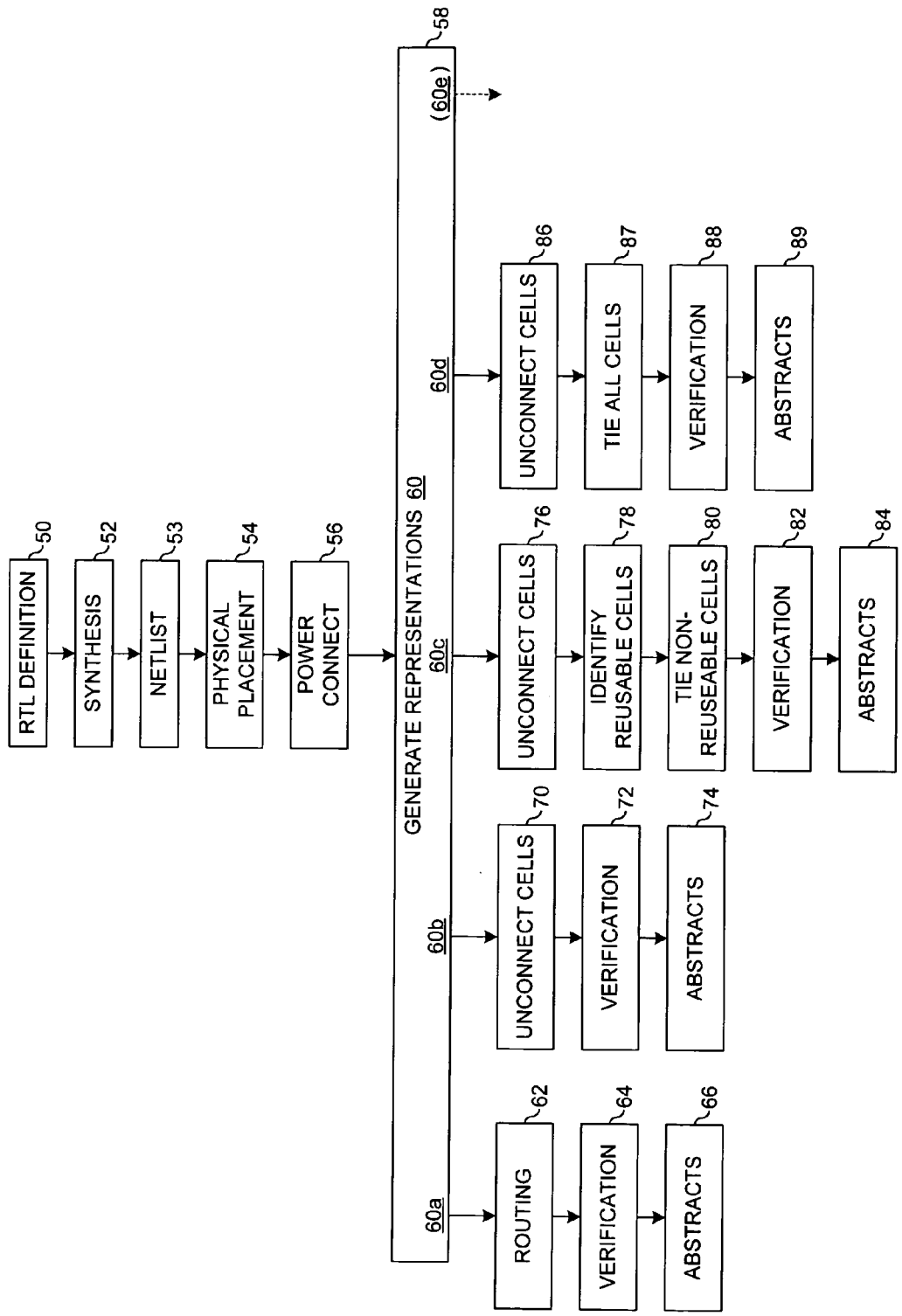
FIG. 5 is a flow diagram of a design process for designing a module in accordance with a preferred embodiment of the present invention.

FIGS. 5 and 6(*a–c*) may illustrate a design process for developing the module 36*a* for inclusion in the slice 19. The design process may be an initial design process performed prior to fabrication of the slice 19 (in contrast to a customization design process described later). The design process may be carried out at least partly using one or more computer programs executing on a computer. At a step 50, the functionality of the module 36*a* may be defined using a functional description (e.g., RTL) or hardware description language (HDL), such as Verilog or VHDL. At a step 52, the module 36*a* may be synthesised using a computer-based synthesis tool, and at a step 53, a netlist may be generated. The netlist may define the module 36*a* in terms of logical connections between the cells 40. The cells 40 may be selected by the synthesis tool from a pre-defined library of available cells 40. The netlist may define logical connections without specific physical placement of the cells 40 relative to each other.

At a step 54, the cells 40 may be physically placed relative to each other within the design of the module 36*a*, (e.g., by a computer-based cell placement tool). At a step 56, the design of power connections to the module 36*a* at the power distribution layer 25 may be carried out using a computer-based design tool, and routing lines may be defined for routing power to the cells 40 within the module. The step 56 may complete the definition of a portion of the design of the module 36*a* within the slice 19. The data produced at the step 56 may be sufficient for pre-fabrication of the slice 19.

At a step 58, the process may proceed to generate a number of representations 60 for customization of the module 36*a* according to different design situations. In one example, four optional different representations 60*a–d* may be described. The method may be repeated from the step 58 for each representation 60*a–d* that may be generated.

The representation 60*a* may represent the design of the module 36*a* in a situation in which the module 36*a* may be chosen for use by the designer. At a step 62, connections to and/or between different cells 40 may be routed within the module 36*a* by a computer-based routing tool. The routing tool may be configured to automatically define the extent of the reserved portion 44 for the connections within the custom-specific layers 18. The routing tool may automatically determine how many of the custom-specific layers 18 may be occupied by the reserved portion 44. The routing tool may automatically determine and place the connections within the reserved portion 44. At a step 64, the design of the module 36*a* may be verified by one or more of a Design Rule Check (DRC) tool and a Layout Versus Schematic (LVS) tool. The DRC and/or LVS tools may be computer-based tools for automatically checking that the final design of the module 36*a* meets predetermined design rules and/or matches the original HDL definition and/or matches the netlist. At a step 66, one or more abstracts of the design of the module 36*a* may be generated as the representation 60*a*.

Figure 6C:
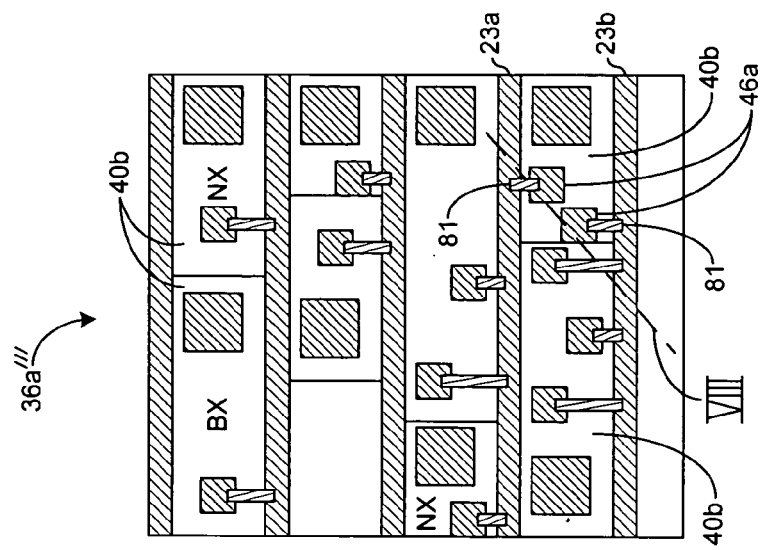
FIGS. 6a–c are schematic horizontal sections similar to FIG. 4 illustrating different design representations of the module of FIG. 4.
Figure 6B:
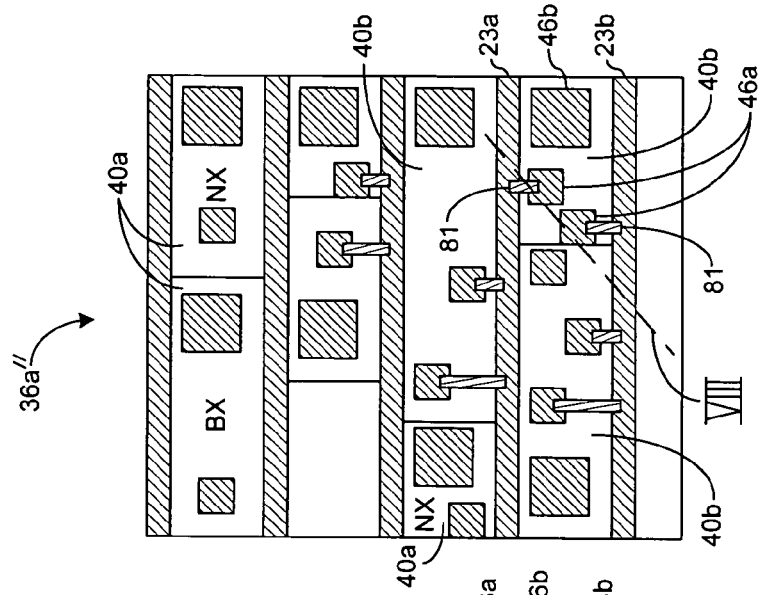
Figure 6A:
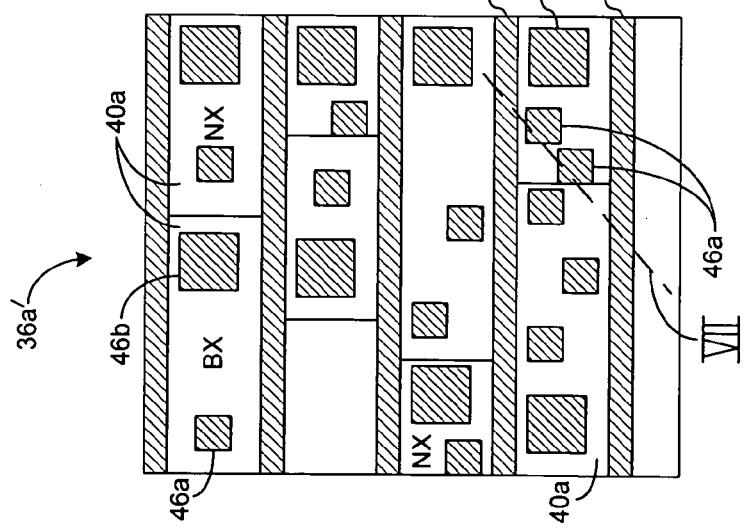
Figure 7:
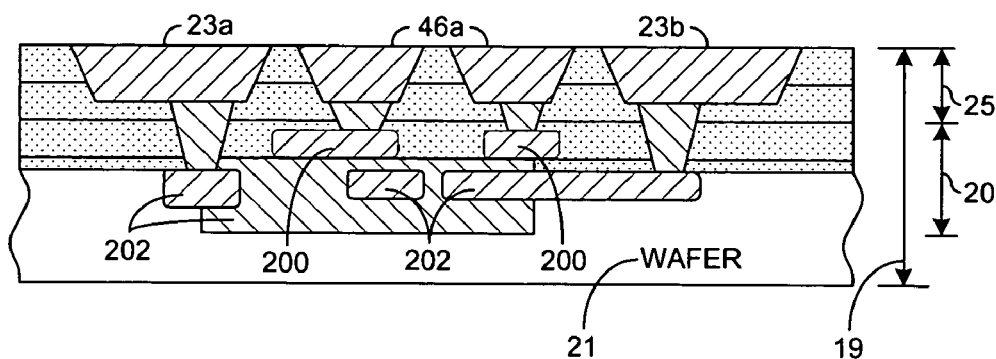

The representation 60*b* may represent a design of a module 36*a*' (FIGS. 6*a* and 7). The module 36*a*' may illustrate an example of the module 36*a* in a situation in which the module 36*a* may not be chosen for use by the designer, and all of the cells 40 may be reusable cells 40*a*. At a step 70, any connections to or between the terminals 46 of the cells 40*a* within the module design 36*a* may be removed. In particular, connections to the input terminals 46*a* and/or the output terminals 46*b* may be removed. As may be seen in FIGS. 6*a* and 7, the input and output terminals 46*a* and 46*b* of all of the cells 40 may be unconnected and, therefore, available for re-use during a future customization (described later). Referring to FIG. 7, within the slice 19, the input terminals 46*a* may lead to polysilicon gate areas 200. The power supply rails 23*a* and 23*b* may be respectfully coupled to diffused regions 202 of the integrated layer 20. The power supply rails 23*a* and 23*b* may be of different voltages, for example, VDD and VSS, respectively. The cell 40*a* may thus be powered and the terminals 46 made accessible for custom connections in the later customization process. Referring back to FIG. 5, at a step 72, verification may be carried out in a similar manner to that described for the step 64. At a step 74, one or more abstracts of the design of the module 36*a*' may be generated as the representation 60*b*. The module 36*a*' may not have a reserved region 44, because there may be no interconnections to the terminals 46 of the cells 40*a*.

Figure 8:
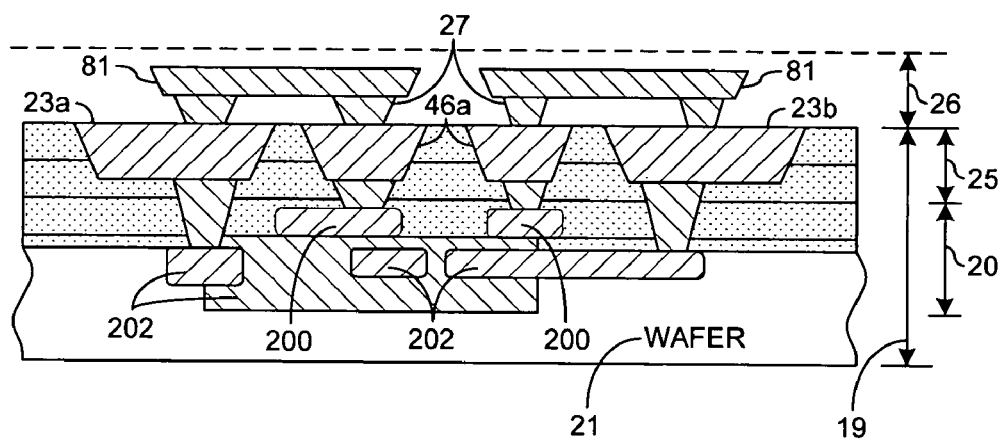
FIG. 8 is an enlarged vertical section along the line VIII of FIGS. 6b and 6c.

The representation 60c may represent a design of a module 36a" (FIGS. 6b and 8). The module 36a" generally represents an example of the module 36a in a situation in which only some of the cells 40 may be reusable cells 40a. As explained previously, the non-re-usable cells 40b may comprise cells that may not be suitable for reuse and/or cells that may specifically be excluded according to the particular design situation. At a step 76, any connections to or between the terminals 46 of the cells 40 may be removed, in a similar manner to the step 70. At a step 78, a determination may be made to identify which of the cells 40 are reusable cells 40a, and which are non-reusable cells 40b. For example, the buffer cell (BX) and the inverter cells (NX) may be determined to be reusable cells 40a, and other cells may be determined to be non-reusable cells 40b. At a step 80, the input terminal 46a and/or output terminal 46b for each non-reusable cell 40b may be coupled by a connection 81 to a power line 23a, 23b in the conductive layer 25. The connection 81 may be made in the first interconnection layer 26 of the custom-specific layers 18 adjacent to the slice 19. Connecting at least some of the terminals 46 (e.g. the input terminals) of unused cells 40b to stable voltages may reduce or avoid leakage currents that might otherwise result from floating or undefined signal levels at the terminals 46. The reserved portion 44 may be defined within only the first custom-specific layer 18 adjacent to the slice 19, for accommodating the power connections 81. The terminals of the reusable cells 40a may remain unconnected to a power line. At a step 82, verification may be carried our in a similar manner to that described for the step 64. At a step 84, one or more abstracts of the design of the module 36a" may be generated as the representation 60c.

The representation 60d may represent a design of a module 36a''' (FIGS. 6c and 8). The module 36a''' may represent an example of the module 36a in a situation in which the module 36a may not be chosen by the designer for use, and none of the cells 40 of the module 36a may be available for reuse. At a step 86, any connections to or between the terminals 46 of the cells 40 may be removed, in a similar manner to the step 70. At a step 87, the input terminal 46a and/or output terminal 46b for each cell 40b may be coupled by an interconnection 81 to a power line in the power distribution layer 25. As explained previously, connecting the terminals of unused cells 40b may reduce or avoid leakage currents. The reserved portion 44 may be defined within only the first custom-specific layer 18 adjacent to the slice 19, for accommodating the power connections 81. At a step 88, verification may be carried out in a similar manner to that described for the step 64. At a step 89, one or more abstracts of the module 36a''' may be generated as the representation 60d. Although the representation 60d may not contain any re-usable cells 40a, the representation 60d may still be significant because it may contain the definition of the power connections 81 to the terminals 46 and/or the definition of the extent of the reserved portion 44 of the custom-specific layers 18.

The representations 60b and 60c may include additional information (not shown) defining whether the reusable cells 40a may be used as additional sub-circuits within the custom design and/or as repeater sub-circuits for routing. A characteristic of the representations 60 that may be identifiable in the finished die 12 may be the presence of cells 40 for forming a module 36, but which may not be used functionally and may have one or more terminals 46 coupled to a power rail 23.

Additional representations (depicted schematically at 60e) may provide a hierarchical "breakdown" of reusable cells 40a within the module 36a. For example, a general purpose processor module may include a numeric processor sub-module that may be usable as a first reusable cell 40a if the general purpose processor is not used in the custom design. The numeric processor sub-module may itself contain component cells (e.g., buffers, counters, etc.) that may be re-usable as other reusable cells 40a if the numeric processor is not used in the custom design. The hierarchical representations 60e may be generated using a process similar to that of the representations 60a–d described above.

Figure 9:
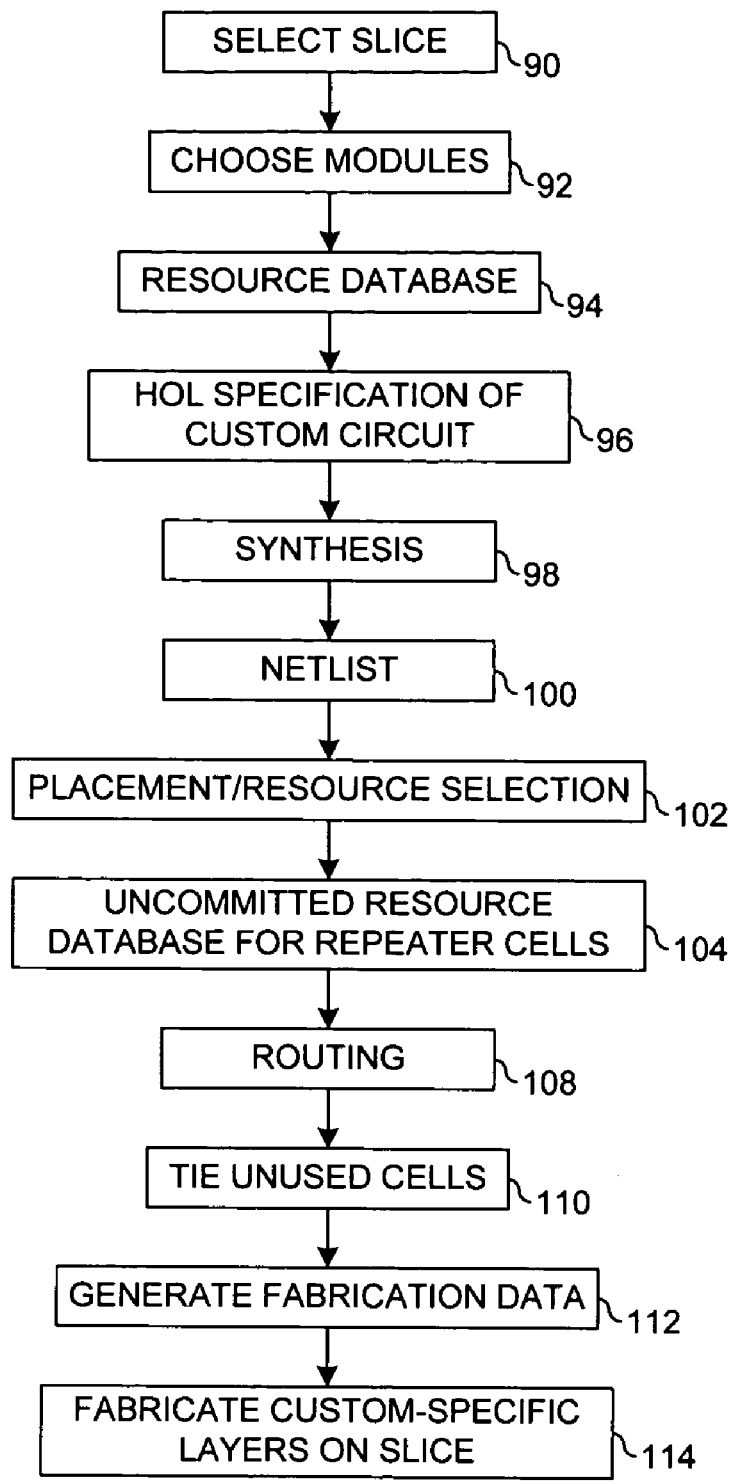
FIG. 9 is a flow diagram of a customization process for forming a die in accordance with a preferred embodiment of the present invention.

FIG. 9 generally illustrates an example customization process for generating a custom design based on a slice 19, and using the representations 60 described above. The customization process may be carried out after the slice 19 has been pre-fabricated. The customization process may determine a design of the custom-specific layers 18. The customization process may be carried out using one or more computer programs executing on a computer. At a step 90, the designer may select a slice 19 that is suitable (e.g., comprises resources desired) for the general type of circuit application. The slice 19 may be selected from a range of different slices produced by a manufacturer. At a step 92, the designer may indicate, for each module 36 within the slice 19, whether or not to use the respective module 36. At a step 94, a database may be provided or generated of the available resources within the slice 19. The resources may comprise one or more of the general-purpose circuit elements 24, the sub-circuits 34 and the modules 36.

When a particular module 36 is not to be used, the resources may further comprise any re-usable cells 40a of the module 36. The database may include, for each module 36, one or more of the representations 60. The specific representations 60 provided may depend on whether or not the designer may have chosen to use the respective module 36, and on the availability of re-usable cells 40a. At a step 96, the custom circuit may be defined and verified using, in one example, a Hardware Description Language (HDL). At a step 98, the HDL specification may be synthesized using a computer based synthesis tool, and at a step 100, a netlist may be generated. The netlist may define logical connections between resources in the slice 19, without any specific physical layout. At a step 102, a computer-based placement/selection tool may be used to map the netlist to a physical layout of the resources on the slice 19. The placement/selection step 102 may optimise the selection of resources from the general-purpose circuit elements 24, the sub-circuits 34, and any re-usable cells 40a from one or more unused modules 36.

At a step 104, a database may be generated of any resources that may not have been committed during the step 102, and that may be configurable as repeater cells 106 (FIGS. 10 and 11) for routing interconnections around the die 12. Each repeater cell 106 may function to preserve the integrity (e.g., voltage level) and/or timing (e.g., slew rate) of a signal that may be routed along a long signal path and/or close to a source of potential interference. The repeater cells 106 may typically comprise a buffer 106a and/or an inverter 106b. In one example, an even number of inverters 106b may be used to preserve a polarity of a logic signal. The repeater cells 106 may be implemented with uncommitted general-purpose circuit elements 24 and/or uncommitted sub-circuits 34 and/or uncommitted reusable cells 40a.

Figure 10:
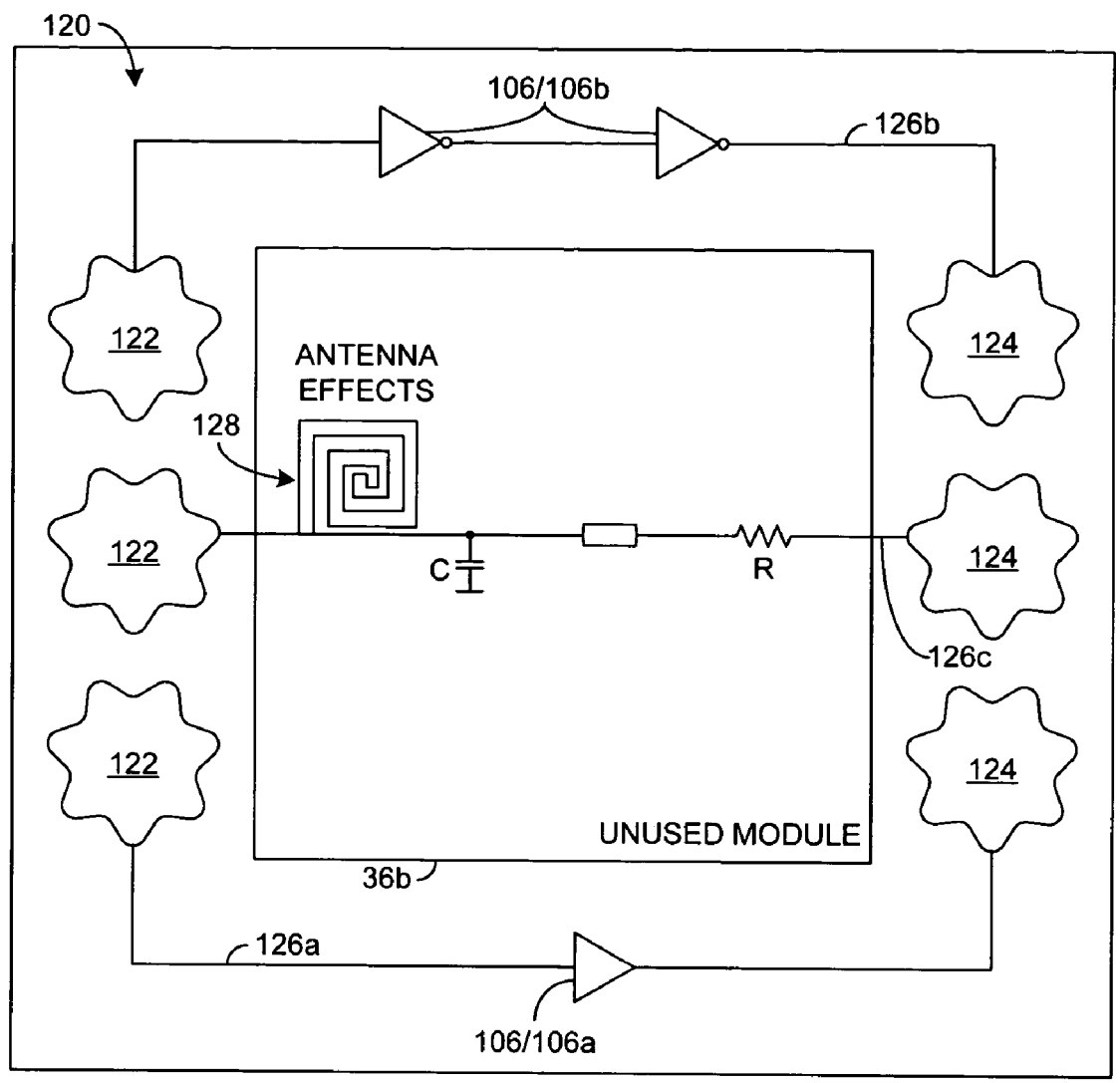
FIG. 10 is a block diagram illustrating routing over an unused module.
Figure 11:
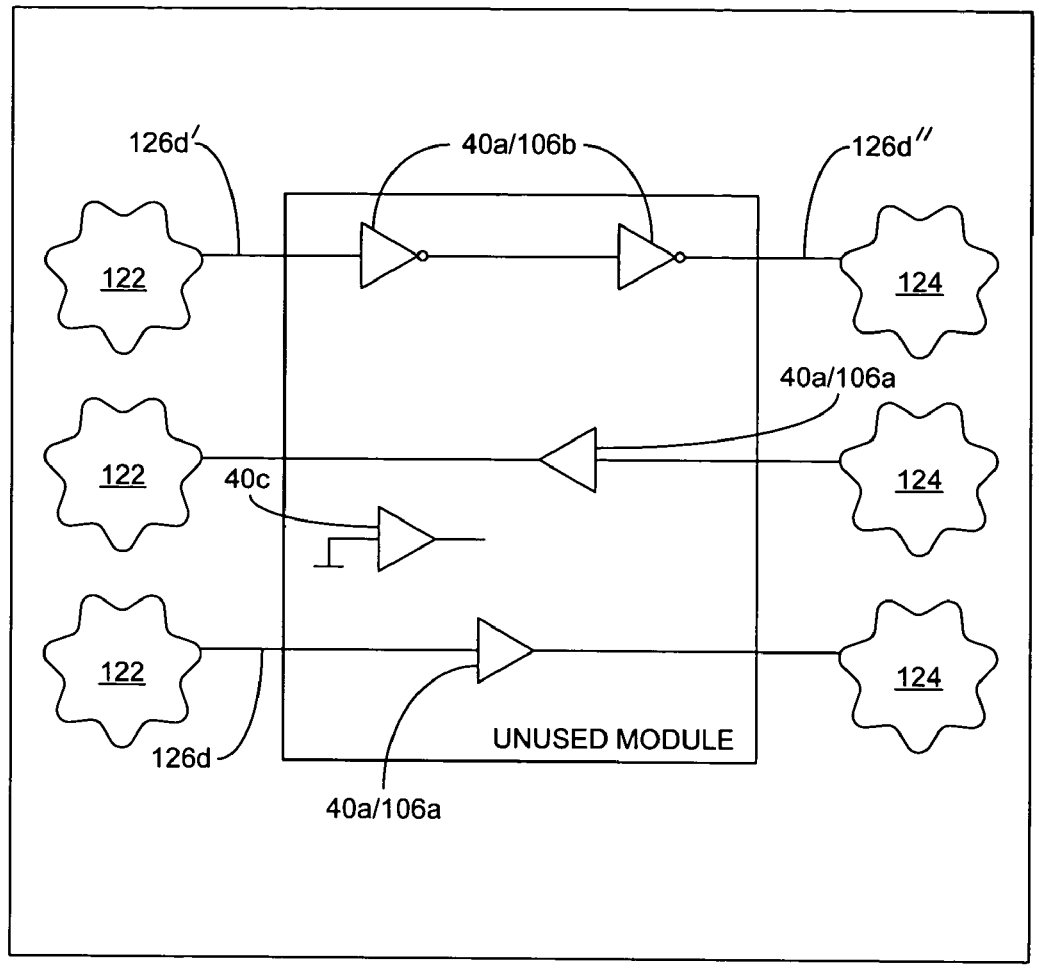
FIG. 11 is a block diagram illustrating routing using uncommitted resources of an unused module.

Referring back to FIG. 9, at a step 108, a computer-based routing tool may be used to automatically determine the routes of interconnections (e.g., connecting wires and/or vias) within the interconnection layers 26 of the custom-specific layers 18. Referring to FIGS. 10 and 11, the routing tool may be configured to handle routing of a connection 120 from a first point 122 on a first side of an unused module 36*b* to a second point 124 on another side (e.g., an opposite side) of the module 36*b*. The routing tool may be configured to route the connection as one of more of a first wire 126*a*, a second wire 126*b*, a third wire 126*c* or a fourth wire 126*d*. In a first example, the wire 126*a* (FIG. 10) may be routed around a periphery of the module 36*b* using a repeater cell in the form of a buffer 106*a*. In a second example, the wire 126*b* (FIG. 10) may be routed around a periphery of the module 36*b* using repeater cells in the form of inverters 106*b*. A potential disadvantage of wires 126*a* and/or 126*b* may be that a length of each wire is relatively long compared to the closest distance between the points 122 and 124. A further disadvantage may be that routing wires around the periphery of the module 36*b* may cause routing congestion if there are a large number of connections to be made.

In a third example, the wire 126*c* (FIG. 11) may be routed over the unused module 36*b* using the interconnection layers 26 without any repeater cell 106. Although the wire 126*c* may have a shorter length and may avoid peripheral congestion, the wire 126*c* may have a potential disadvantage. For example, the signal carried by the wire 126*c* may be vulnerable to parasitic effects, due to an absence of a repeater cell and/or interference with the unused module 36*b*. Parasitic effects may include, for example, one or more of: a parasitic antenna effect 128; a parasitic capacitance C; a parasitic inductance L, and a parasitic resistance R. The parasitic effects may affect the timing and/or integrity of the signal carried by the wire 126*c*.

In a fourth example, the wire 126*d* (FIG. 11) may be implemented with a repeater cell 106*a* or 106*b*. The repeater cell 106*a* or 106*b* may comprise an uncommitted reusable cell 40*a* of the unused module 36*b*. The wire 126*d* may provide a relatively short signal path and/or may avoid peripheral congestion around the unused module 36*b* and/or may avoid parasitic effects. When a plurality of reusable cells 40*a* is available for use as repeater cells, the router tool may route a plurality of wires 126*d*, 126*d'* and 126*d''* across the module 36*b* using the plurality of reusable cells 40*a*. For example, the wire 126*d* may use two spare cells 40*a* in the form of inverters 106*b*. The wire 126' may use another spare cell 40*a* in the form of a buffer 106*a*. The wire 126'' may use another spare cell 40*a* in the form of a buffer 106*a* to provide a signal path in an opposite direction to the wires 126*d* and 126*d'*. The router tool may be configured automatically to route a signal via the wire 126*d* in preference to the wires 126*a*–*c*. The router tool may be configured automatically to select preferentially an unused cell 40*a* for routing a connection across the unused module 36*b*. A similar technique may be used for routing a connection across one or more unused sub-circuits 34. The router may be configured automatically to select preferentially an unused sub-circuit 34 for routing a connection across an array of unused sub-circuits 34.

Referring back to FIG. 9, at a step 110, unused reusable cells 40*a* and/or unused sub-circuits 34 may be coupled (e.g., tied off) to a power supply rail. For example, an input terminal and/or an output terminal of the respective unused reusable cell 40*a* and/or unused sub-circuit 34 may be coupled to a power supply rail. As explained previously, coupling a terminal of a cell 40*a* and/or a sub-circuit 34 to a power supply rail may reduce or avoid leakage currents. As illustrated in FIG. 11, a cell 40*c* may be a reusable cell 40*a* that is unused (e.g., the cell 40*c* may not be used during the selection/placement step 102 and/or during the routing step 108). An input of the cell 40*c* may be coupled to a power supply rail, for example, ground.

Referring again to FIG. 9, at a step 112, fabrication data may be generated for fabricating the die 12. The die 12 may be fabricated at step 114 based on the fabrication data. When the slice 19 is pre-fabricated, the fabrication data may define the custom-specific layers 18 for customizing the pre-fabricated slice 19 to form the die 12. When the slice 19 is not pre-fabricated, the fabrication data may define the custom-independent layers 16 and the custom-specific layers 18 of the die 12 for fabrication.

Figure 13:
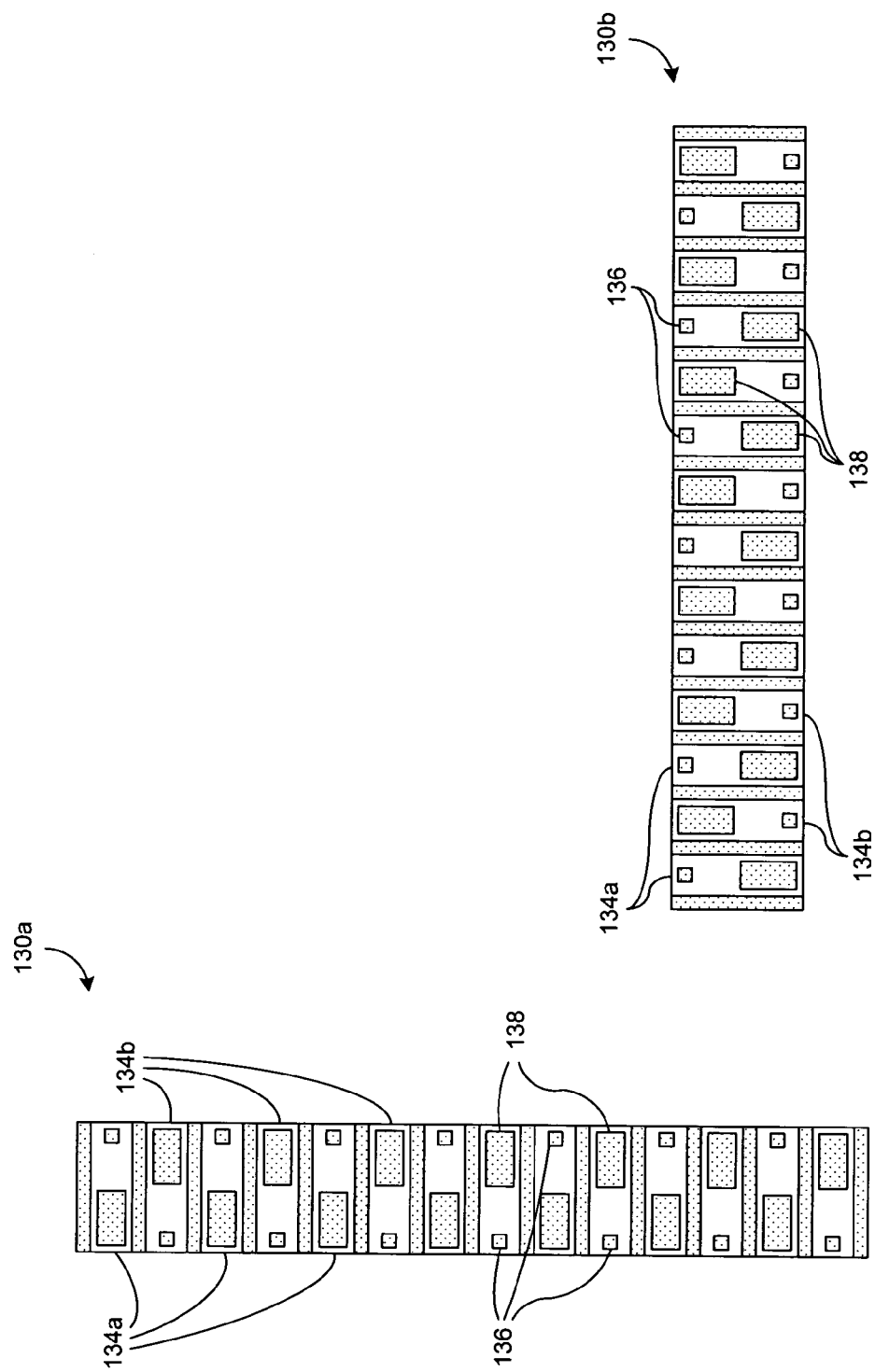
FIGS. 13a and 13b are schematic block diagrams illustrating in more detail orthogonal buffer sub-circuits in the die of FIG. 12.
Figure 14:
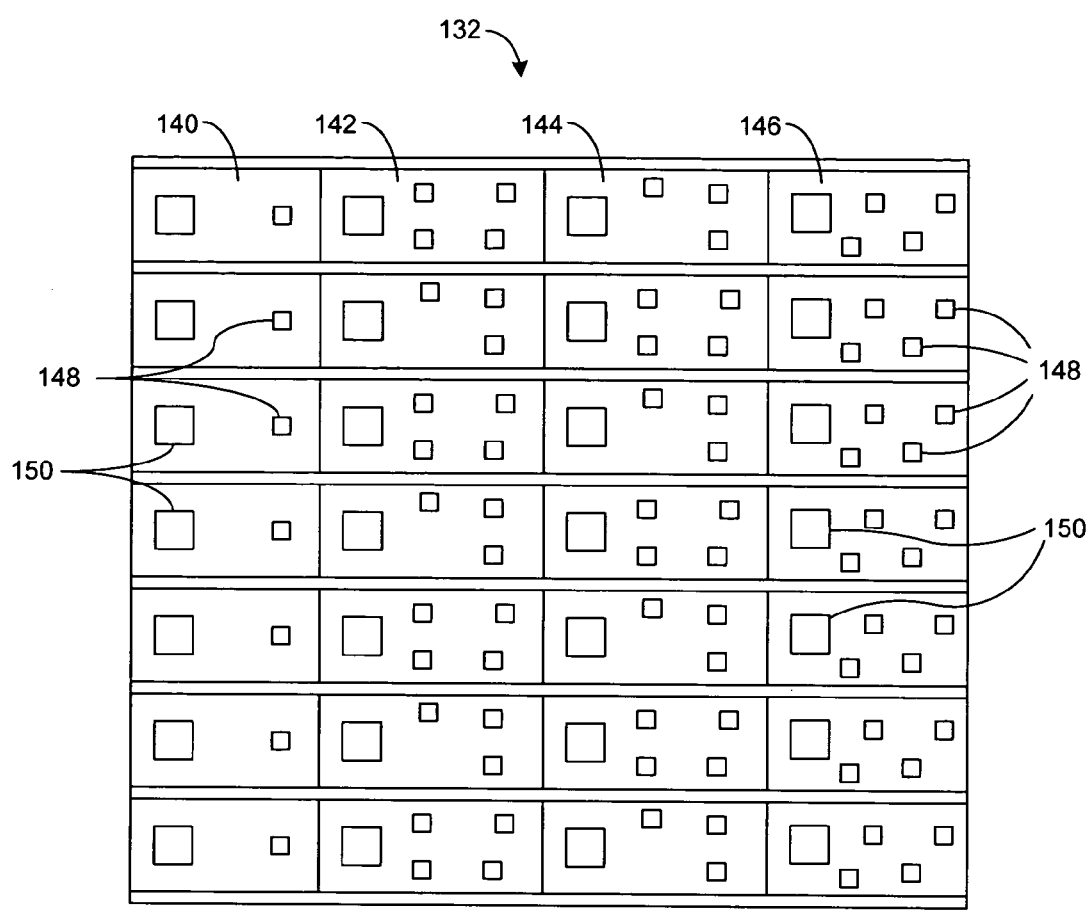
FIG. 14 is a more detailed block diagram illustrating logic array sub-circuits in the die of FIG. 12.

Referring to FIGS. 12–14, diagrams are shown illustrating another embodiment of a slice 19*a* for a semiconductor die 12*a*. The slice 19*a* may have any or all of the features (including design and fabrication features) of the slice 19. The same reference numerals may denote features equivalent to the slice 19. The slice 19*a* may include a general-purpose circuit area 32*a* and a plurality of standard circuit areas 30*a*. Although not shown explicitly in FIG. 12, the slice 19*a* may also include one or more special circuit areas (similar to the slice 19). A characteristic of the slice 19*a* may be a distribution of the standard cell areas 30 across the slice 19*a*. The standard cell areas 30 may be distributed such that the sub-circuits 34*a* may be available locally at different locations across the slice 19*a*.

The sub-circuits 34*a* may be selected to be useful for the general type of circuit application for which the slice 19*a* may be intended. In the illustrated embodiment, the sub-circuits 34*a* may include buffer arrays 130*a*, 130*b*, and glue logic arrays 132. The buffer arrays may include two types of array 130*a* and 130*b* arranged orthogonally with respect to each other. The buffer arrays 130*a* and 130*b* may be arranged on a grid pattern. A grid pattern of orthogonal arrays 130*a*, 130*b* may provide excellent versatility for optimum placement/selection of the slice resources for implementing a custom circuit. Referring to FIGS. 13*a* and 13*b*, each of the arrays 130*a* and 130*b* may comprise a generally elongate array of buffer sub-circuits 134*a* and 134*b*. Each buffer sub-circuit 134*a* and 134*b* may include an input terminal 136 and an output terminal 138. The terminals 136 and 138 may be located towards opposite ends of the respective buffer sub-circuits 134*a* and 134*b*. Adjacent buffer sub-circuits 134*a* and 134*b* may be arranged with alternate orientations. The alternate orientations may further improve the versatility for optimum placement/selection of the slice resources for implementing the custom circuit.

The glue logic arrays 132 may comprise, for example, sub-circuits 140–146 that may be used individually or combined to provide different functionality. Each sub-circuit 140–146 may include at least one input terminal 148 and at least one output terminal 150. The sub-circuits may comprise one or more buffers 140 and/or one or more gates 142 (for example, XOR gates) and/or one or more multiplexers 144 and/or one or more flip-flops 146. The glue logic arrays 132 may be two-dimensional arrays of repetitions of the sub-circuits 140–146. The glue-logic arrays 132 may be arranged generally centrally in each unit of the grid pattern defined by the orthogonal buffer arrays 130*a* and 130*b*. A central arrangement of the glue-logic arrays 132 may provide excellent versatility for optimum placement/selection of the slice resources for implementing the custom circuit.

In a similar manner to the slice 19, during the design of the custom-specific layers 18 (not shown in FIG. 12) for implementing the custom circuit, the input terminals 136 or 148 and/or the output terminals 138 or 150 of any of the sub-circuits 134*a* that may not be used, may be coupled to one or more power supply rails. Coupling the terminal(s)

136, 148, 138 and/or 150 to the power supply rail(s) may avoid or reduce leakage currents.

The functions performed by the flow diagrams of FIGS. 5 and 9 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

The present invention may also include a storage medium including a representation of design data of a circuit and/or slice and/or die in accordance with the present invention. The design data may be a representation prior to customization and/or after customization. The design data may include a representation of custom-specific layers and/or custom-independent layers. The design data may be data for fabrication. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the sprit and scope of the invention.

The invention claimed is:

1. A representation of a macro for an integrated circuit layout comprising:
   a plurality of diffusion regions;
   a metal layer connected to said diffusion regions; and
   at least one interconnection layer above said metal layer, wherein (i) said diffusion regions and said metal layer form a plurality of sub-circuit cells of a first module, (ii) said at least one interconnection layer connects at least two of said sub-circuit cells in accordance with said macro to complete said first module having a predefined functionality, and (iii) said sub-circuit cells include at least one reusable circuit cell configured with a plurality of signal terminals such that when said predefined functionality of said module is not used in a custom design, said reusable circuit cell is connected to at least one second module through said terminals by said at least one interconnection layer in said custom design.

2. The representation of claim 1, wherein said signal terminals of said reusable circuit cell comprise an input terminal and an output terminal accessible by said at least one interconnection layer of said integrated circuit layout.

3. The representation of claim 1, wherein said reusable circuit cell comprises a buffer.

4. The representation of claim 1, wherein said reusable circuit cell comprises an inverter.

5. A computer based design tool for generating a design representation of a macro for inclusion in an integrated circuit layout, the macro having a predefined functionality and comprising (i) a plurality of diffusion regions and (ii) a metal layer connected to said diffusion regions to form a plurality of sub-circuit cells and (iii) at least one interconnection layer above said metal layer to connect at least two of said sub-circuit cells to form a first module in accordance with said macro, wherein the tool is configured to:
   generate said design representation of said macro such that at least one of said sub-circuit cells is a reusable sub-circuit cell having a plurality of signal terminals that are (i) connectable to at least one second module through said at least one interconnection layer in a custom design when said predefined functionality of said first module is not used in said custom design and (ii) connected internal to said first module when said predefined functionality is used in said custom design.

6. The computer based design tool of claim 5, wherein said tool is further configured to generate for said reusable sub-circuit cell, a representation of an input terminal and a representation of an output terminal for connecting said reusable sub-circuit cell to said at least one interconnection according to one of (i) said macro and (ii) said custom design.

7. The computer based design tool of claim 5, wherein said reusable sub-circuit cell comprises a buffer.

8. The computer based design tool of claim 5, wherein said reusable sub-circuit cell comprises an inverter.

9. The computer based design tool of claim 5, wherein said design tool is configured to generate a plurality of said design representations of said macro (i) each capable of performing said predefined functionality and (ii) in which different numbers of said sub-circuit cells are said reusable sub-circuit cells.

10. The computer based design tool of claim 5, wherein said design tool is configured to generate a second design representation of said macro in which none of said sub-circuit cells are said reusable sub-circuit cells.

11. The computer based design tool of claim 5, wherein said design tool is further configured to generate a parameter defining a reuse permission for said reusable sub-circuit cell.

12. The computer based design tool of claim 11, wherein said reuse permission comprises a permission to use said reusable sub-circuit cell as a repeater cell for routing.

13. The computer based design tool of claim 11, wherein said reuse permission comprises a permission to reuse said reusable sub-circuit cell as a fully reusable cell.

14. A computer based design tool for automatically designing a physical routing of conductive paths across a predesigned integrated circuit slice, wherein the tool is configured to route one of more of said conductive paths over an area of a circuit module having a predefined functionality, the routing comprising the steps of:
   (a) identifying a reusable circuit cell of said circuit module that is (i) usable within said circuit module as part of said predefined functionality and (ii) reusable as a first repeater cell;
   (b) placing a first connection path extending over a first portion of said area from outside said area to a terminal of said first repeater cell when said predefined functionality is unused in a custom design on said predesigned integrated circuit slice; and
   (c) placing a second connection path according to a macro defining said circuit module, said second connection path extending over a second portion of said area from inside said area to said terminal when said predefined functionality is used in said custom design on said predesigned integrated circuit slice.

15. The computer-based design tool of claim 14, wherein said tool is configured to place said first connection path and said second connection path in one or more user specified interconnection layers of said integrated circuit slice defined by (i) said macro before said custom design is created and (ii) said custom design if said predefined functionality is unused.

16. The computer based design tool of claim 14, wherein said first repeater cell comprises a buffer circuit cell.

17. The computer based design tool of claim 14, wherein said first repeater cell comprises an inverter circuit cell.

18. The computer based design tool of claim 14, further comprising the steps of:
   identifying a second circuit cell of said circuit module that is reusable as a second repeater cell in combination with said first repeater cell when said predefined functionality is unused in said custom design;
   placing said second connection path to extend from an output terminal of said first repeater cell to an input terminal of said second repeater cell; and
   placing a third connection path extending over a third portion of said area from an output terminal of said second repeater cell to external said area.

19. The computer based design tool of claim 18, wherein said first and second repeater cells are of the same circuit type.

20. The computer based design tool of claim 19, wherein said first and second repeater cells are inverter circuit cells.

21. A method for designing a macro for a first module included in an integrated circuit, comprising the steps of:

(A) generating a design representation of said macro to (i) provide a predefined functionality in said first module, (ii) comprise a plurality of diffusion regions and a metal layer connected to said diffusion regions to form a plurality of sub-circuit circuit cells and (iii) further comprise at least one interconnection layer configured to connect at least two of said sub-circuit cells to form said first module when a custom design uses said predefined functionality; and (B) configuring at least one of said sub-circuit cells as one of (i) part of said predefined functionality when said predefined functionality is used in said custom design and (ii) a reusable sub-circuit cell connected external to said first module when said predefined functionality is not used in said custom design.

22. The method of claim 21, wherein the step of generating said design representation comprises the sub-step of:
   generating a plurality of design representations of said macro (i) each capable of performing said predetermined functionality when said reusable sub-circuit cells are connected internal said first module and (ii) in which different numbers of said sub-circuit cells are reusable sub-circuit cells.

23. The method of claim 21, wherein further comprising generating a second design representation of said macro in which none of said sub-circuit cells are said reusable sub-circuit cells.

24. The method of claim 21, further comprising a step of generating a parameter defining a reuse permission for said reusable sub-circuit cell.

* * * * *